(12) United States Patent
Schwarzhans

(10) Patent No.: US 11,849,856 B2
(45) Date of Patent: Dec. 26, 2023

(54) SLEEPING COMPARTMENT WITH A SLEEPING REGION AND AN ELECTRICALLY CONDUCTING CURTAIN

(71) Applicant: SH Immobilien GmbH, Bludenz (AT)

(72) Inventor: Ernst Schwarzhans, Bludenz (AT)

(73) Assignee: SH Immobilien GmbH, Bludenz (AT)

( * ) Notice: Subject to any disclaimer, the term of this patent is extended or adjusted under 35 U.S.C. 154(b) by 0 days.

(21) Appl. No.: 18/166,078

(22) Filed: Feb. 8, 2023

(65) Prior Publication Data
US 2023/0248157 A1 Aug. 10, 2023

(30) Foreign Application Priority Data
Feb. 8, 2022 (AT) .................................... A 37/2022

(51) Int. Cl.
| | | |
|---|---|---|
| H05K 9/00 | (2006.01) | |
| A47C 31/00 | (2006.01) | |
| A47C 29/00 | (2006.01) | |
| A47G 27/02 | (2006.01) | |
| A47H 1/06 | (2006.01) | |
| A47H 23/08 | (2006.01) | |
| E04B 1/92 | (2006.01) | |

(52) U.S. Cl.
CPC .......... *A47C 31/004* (2013.01); *A47C 29/003* (2013.01); *A47G 27/02* (2013.01); *A47H 1/06* (2013.01); *A47H 23/08* (2013.01); *E04B 1/92* (2013.01); *H05K 9/0003* (2013.01); *H05K 9/0064* (2013.01)

(58) Field of Classification Search
CPC .................................................. H05K 9/0003
See application file for complete search history.

(56) References Cited

U.S. PATENT DOCUMENTS 3,547,136 A * 12/1970 Koenig ................... E04H 15/00
135/117
5,081,071 A * 1/1992 Hirschkoff ........... H05K 9/0001
600/409

(Continued)

FOREIGN PATENT DOCUMENTS

| AT | 508627 | 3/2011 |
| CN | 201139293 | 10/2008 |

(Continued)

OTHER PUBLICATIONS

Article from esmog-shop.com (4 pages), downloaded on Sep. 28, 2020 in German language and an English machine translation of its text. Sep. 28, 2020.

*Primary Examiner* — Hung V Ngo
(74) *Attorney, Agent, or Firm* — Volpe Koenig

(57) ABSTRACT

A sleeping compartment with a sleeping region and an electrically conducting curtain, which can be arranged around the sleeping region, having a rail system by which the conducting curtain is mounted in a displaceable manner. The rail system includes at least one rail and a multiplicity of connecting elements, the connecting elements being connected to the conducting curtain and being mounted in the at least one rail in a displaceable manner. The rail system is configured such that the conducting curtain is connected to the at least one rail in an electrically conducting manner, preferably such that the conducting curtain is earthed by way of the rail.

15 Claims, 3 Drawing Sheets

(56) References Cited

U.S. PATENT DOCUMENTS

| | | | | |
|---|---|---|---|---|
| 2004/0006267 | A1* | 1/2004 | Buchanan | G01R 33/025 |
| | | | | 600/409 |
| 2008/0304246 | A1* | 12/2008 | Utschig | A61B 6/102 |
| | | | | 361/818 |
| 2014/0343642 | A1* | 11/2014 | Lauer | H05K 9/0001 |
| | | | | 607/115 |
| 2017/0065089 | A1* | 3/2017 | Schubiger | E04H 15/44 |
| 2017/0198422 | A1* | 7/2017 | Ishikawa | E04B 2/72 |
| 2019/0307026 | A1* | 10/2019 | Babhadiashar | H05K 9/009 |
| 2019/0368191 | A1* | 12/2019 | Shibuya | H05K 9/0003 |
| 2021/0038458 | A1 | 2/2021 | Lee | |
| 2022/0346290 | A1* | 10/2022 | Chen | H05K 9/0049 |

FOREIGN PATENT DOCUMENTS

| | | |
|---|---|---|
| CN | 211459557 | 9/2020 |
| DE | 8205405 | 8/1982 |
| DE | 3917631 | 12/1990 |
| DE | 202004007037 | 9/2004 |
| DE | 102007054256 | 5/2009 |
| DE | 202016000203 | 4/2016 |
| DE | 202020101200 | 4/2020 |
| DE | 102020132305 | 6/2021 |
| WO | 2007059844 | 5/2007 |
| WO | 2015001165 | 1/2015 |
| WO | 2016017595 | 2/2016 |

* cited by examiner

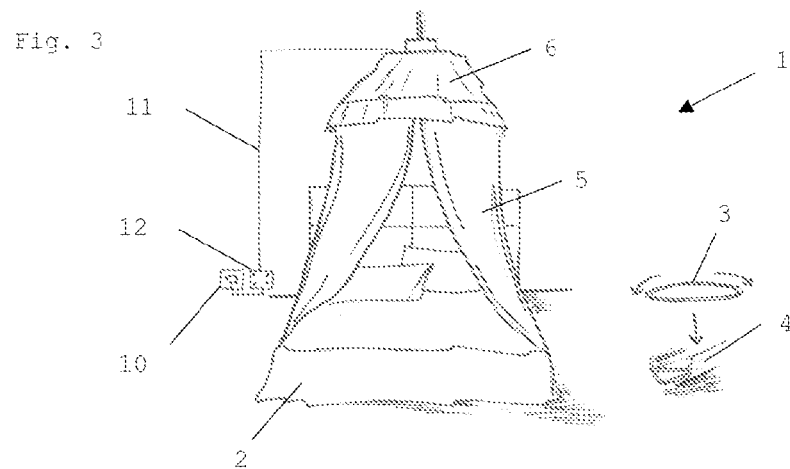
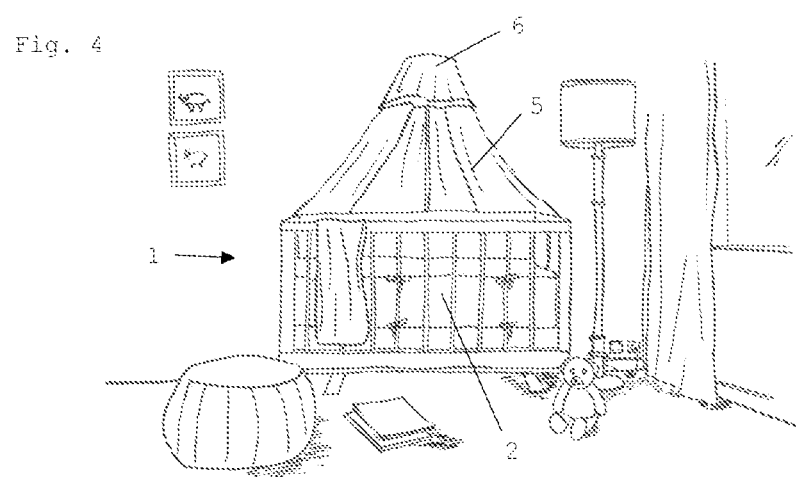
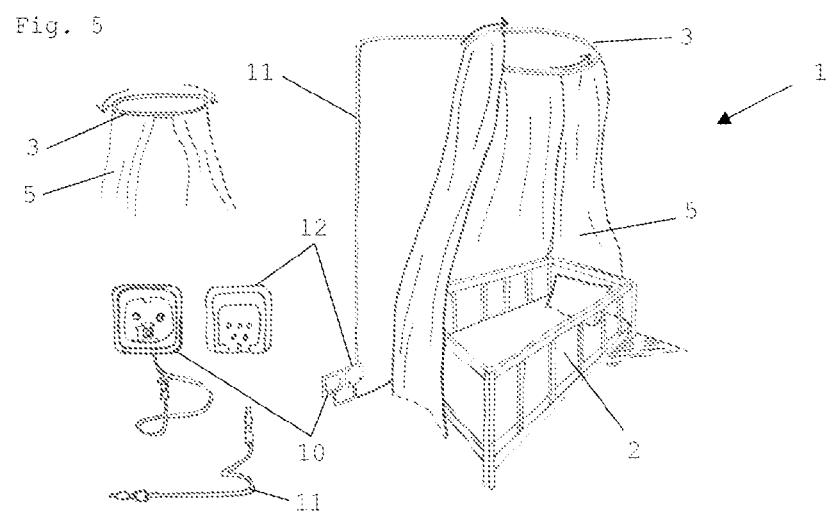

SLEEPING COMPARTMENT WITH A SLEEPING REGION AND AN ELECTRICALLY CONDUCTING CURTAIN

CROSS-REFERENCE TO RELATED APPLICATIONS

This application claims priority to Austrian Patent Application No. A37/2022, filed Feb. 8, 2022, which is incorporated herein by reference as if fully set forth.

TECHNICAL FIELD

The present invention relates to a sleeping compartment with a sleeping region and an electrically conducting curtain, which can be arranged around the sleeping region.

BACKGROUND AND PRIOR ART

There are a multiplicity of very different sleeping compartments which make use of the principle of a Faraday cage in an equally wide variety of ways.

A mobile shielding envelope against electro-smog for a bed is disclosed in document DE 202020101200. Here, a sleeping place in the form of a Faraday cage can be constructed by a shielding material on a mattress and a carrying frame as support for a second shielding material.

Another document is US 2021038458 (Sleep Enclosure Systems). This concerns a sleeping compartment which is likewise in the form of a Faraday cage. This compartment has a movable door which can be opened by a mechanism, such that the sleeping compartment is opened and a person can enter the sleeping space.

Another document is CN 211459557 U (Radiation-proof mosquito net). This utility model concerns an earthed net which serves both as mosquito protection and as protection against various types of radiation from various electronic devices.

Another document is AT 508627 A1 (Wellness device). This device is a bed-like construction with various features in order to increase the sense of well-being of a user. In addition to lighting, a fragrancing device or an acoustic device, a heating device is provided. In this invention, the principle of a Faraday cage is limited exclusively to the heating device.

Finally, the following utility model should also be added to the prior art. It is document DE 202004007037 U1 (System for damping or shielding against external electromagnetic radiation acting on a sleeping place or an external electrical field acting thereon). This concerns a sleeping place which is embodied using two woven fabrics. These two woven fabrics consist of an electrically conducting material and are connected to one another in a releasable manner. The effect of a Faraday cage is also realized by the two electrically conductive woven fabric parts surrounding at least certain regions of a sleeping place.

All the documents mentioned above have the following advantages in common. All the inventions make use of the effect of a Faraday cage in order to protect the inside of the sleeping compartment against the action of electrical or electromagnetic fields located on the outside. This is in particular intended to have a positive effect on the sleep behavior of the user.

It is a disadvantage of the present documents and the current prior art that the boundary of the sleeping region, by electrically conducting materials, cannot be opened or closed in a convenient manner. In the majority of cases, a material which reaches down to the floor can be lifted up from the bottom to above the head, in order to enter the sleeping region. In other cases, the sleeping region, by fixed material such as walls, can be entered only via one side, which has a door.

SUMMARY

The object of the present invention is to provide a sleeping compartment with a sleeping region and an electrically conducting curtain, the electrically conducting curtain being able to be displaced in a simple manner, in order to thereby open or close the sleeping region in a convenient manner.

With regard to the present invention, this is achieved by one or more of the features disclosed herein, namely by providing a rail system by which the conducting curtain is mounted in a displaceable manner, the rail system comprising at least one rail, the rail system comprising a multiplicity of connecting elements, the connecting elements being connected to the conducting curtain and being mounted in the at least one rail in a displaceable manner, and the rail system being configured such that the conducting curtain is connected to the at least one rail in an electrically conducting manner, preferably such that the conducting curtain is earthed (or grounded) by way of the rail.

In order to take full advantage of the effect of a Faraday cage, the sleeping compartment may be completely enveloped on all sides with electrically conducting materials. The lateral surface of the sleeping compartment may be enclosed with the displaceable curtain, the lower side with a rug and the top side with a canopy. In this case, all the boundaries should be either completely or at least partially manufactured from electrically conducting materials, for example electrically conducting foils/films or electrically conducting paint for rug and canopy and woven cloth fabric with electrically conducting threads for the curtain. In order for it to be a completely closed Faraday cage, the curtain should rest on the rug or make at least partial contact with the latter. The connecting elements likewise constitute an electrically conducting connection between canopy and curtain, as a result of which a closed Faraday cage is produced.

The sleeping compartment may be earthed, the earthing line possibly leading from the rail system into a domestic socket. The earthing of the sleeping compartment may also be effected in any other way. In addition to the rail system, it is possible for any other part of the sleeping compartment to also be earthed in addition and/or instead. Furthermore, a separate earthing plug may be provided which is compatible with customary sockets. In addition, an overvoltage protection device, which constitutes protection against dangerous overvoltages as a result of lightning strikes, for example, may also be provided between this plug and the rail system.

The use of connecting elements between at least one rail and at least one curtain makes it possible to displace the at least one curtain along the rail in any desired manner. In this way, the curtain can expose the entire sleeping region, by said curtain being pushed together as far as possible, or envelope the entire sleeping region, by said curtain being pushed apart to the maximum length along the rail. The freely displaceable connecting pieces and the existing curtains make any position between a fully exposed position and a maximally closed position possible.

Various rugs for closing off the lower side of the sleeping compartment are possible. In this case, the rug may consist of an insulation layer, which rests directly on the floor, and may have an electrically conducting foil/film or an electrically conducting paint on the insulation layer, in order to close off the Faraday cage toward the bottom. Various sizes, designs, shapes and colors are possible both for the insulating part and the electrically conducting part. Materials that can be used are limited merely by their function as insulation layer or electrically conducting layer.

Various designs may serve both for functionality and aesthetics. It is for example possible for the sleeping compartment to provide a respective curtain on both sides of the sleeping region. The number of curtain parts or portions is not limited, provision being made of at least one curtain which substantially shields the sleeping region. However, it is of course also possible to provide a wall which for example limits the head end. Like the canopy, this wall may be manufactured from solid material, as a textile or as a foil/film. In order to make full use of the effect of the Faraday cage, such a wall should also be electrically conducting in any case if the curtain does not provide shielding around the entire periphery of the sleeping region.

Another variant relates to the canopy, which may be manufactured in a wide variety of embodiments. Not being restricted thereto, said canopy may be embodied, for example, as a panel-like structure above the sleeping region, the rail system running along the edges of said structure. In this case, the canopy and the rail system follow a rectangular or square shape. In contrast thereto, the rail system may alternatively have any other shape, such as the shape of a circle or of a circle segment. As is customary with bed canopies, the canopy may be adorned with a multiplicity of decorative applications and/or decorative materials.

Due to the comprehensive range of embodiments of the sleeping compartment, this is suitable for all customary beds. It is thus possible to use a sleeping compartment according to the invention for a double bed, single bed, bunk bed or for children's beds, wherein the aforementioned bed variants should not be understood as restricting. In the last-mentioned example, the curtain with a circular rail system may be arranged around the entire periphery of a children's bed or crib. As a result, the displaceable curtain makes it possible to shield the sleeping region in a very convenient and comfortable manner while simultaneously allowing easy access to the sleeping region. In this way, it is possible to easily open and close each side of the bed, where it would otherwise be necessary to lift the material up from the floor, raise it to head height and hold it with a hand. When both hands are being used, as is customary when laying down small children, only the possibility of throwing the material backward over your own head remains, whereby one finds oneself in the sleeping region. When exiting the sleeping region, said material may then easily become a trip hazard. As a result, the simple opening and closing of a sleeping compartment with a displaceable and electrically conducting curtain may constitute both an improvement in terms of user convenience and a contribution to accident prevention and avoidance.

In a further convenient embodiment, the rail system may also have two rails running in parallel, as a result of which two curtains can be displaced independently of one another. This makes it possible to use overlapping curtains to provide even simpler gap-less shielding. In other words, the sleeping region may then be separated, without resulting in an annoying gap between two curtains on the same rail. Such a double rail system may also be used as window curtains.

In addition, lighting may also be provided in the sleeping compartment. In order to read, for example, night-time reading matter, LED lights could be installed in the canopy or elsewhere in the sleeping region. Corresponding operator control elements may be installed throughout the sleeping region, wherein here a wall closing off the head end lends itself very well. In such a side wall, light switches, the battery or accumulator housing and lines to the lighting may be provided in the canopy. In this case, the power supply may be effected by way of a domestic power connection. In order for the shielding of the sleeping compartment to be fully functional, it is of course possible for the lighting to be powered by accumulator or battery operation. In this way, although a certain electrical field prevails in the interior of the sleeping compartment, the shielding against electrical or electromagnetic fields still remains intact.

Here, electrically conducting materials may be understood to mean all generally known materials which, on account of their specific resistance or their electrical conductivity, are capable of transmitting current as a conductor. These materials are, in particular, metals and metallic compounds, semiconductor materials, conductive polymers, ion conductors or doped materials. As is generally known, insulators (non-conductors) are not electrical conductors. A selection of customary conductor materials includes silver, copper or steel. Representatives of semiconductor materials are, for example, silicon or gallium arsenide. Typical insulators are, for example, amber or plastics such as silicones. Any material that is sufficiently electrically conducting for the application according to the invention may be used and is not restricted to the aforementioned examples. As orientation aid, however, 1012 Ω·mm2/m may be used as an approximate upper limit for the specific resistance. The majority of electrically conducting materials tend to have a specific resistance of up to 108 Ω·mm2/m.

Here, batteries are understood to mean all electrical energy storage devices and especially primary batteries. Here, accumulators are understood specifically as batteries or secondary batteries that can be recharged repeatedly. This means that the enumeration of "batteries and accumulators" is redundant in this document, since batteries also include secondary batteries in the broadest sense. However, for clearer understanding, particularly with regard to laypersons, the redundant wording used herein is maintained.

Further advantageous embodiments of the invention are defined below and in the claims.

In order for the connecting elements to be mounted in a displaceable manner, in a preferred embodiment, the rail of the rail system may have a protrusion along its longitudinal axis or along the rail axis.

As mentioned, the protrusion may extend over the entire length of the rail or only over partial regions of the rail.

In a further embodiment, the connecting elements may comprise sliding and/or rolling elements which may, for the displaceable mounting, rest on the at least one protrusion mentioned above. In this way, it is possible to achieve displaceable mounting that is easy to produce and it is thus possible to move the connecting elements along the rail axis.

In a further embodiment, the sleeping region may be delimited toward the bottom by an electrically conducting rug, in order to support the effect of the Faraday cage.

In a further embodiment, it is additionally possible to use an electrically conducting canopy above the sleeping compartment, in order to introduce a boundary and to close off the Faraday cage toward the top. In this context, the canopy is intended to mean an upper delimitation of the sleeping compartment in the broadest sense. It is thus a canopy of a bed in the broadest sense.

In a particularly preferred embodiment, this canopy may be embodied from solid material, as foil/film and/or as textile. The usable materials and constructions are not limited by embodiments or variants mentioned herein. Here, all materials and construction solutions that make at least partial use of the effect of the Faraday cage can be used. However, as is customary with canopies, use of a lightweight material or a lightweight construction lends itself.

In a particularly preferred embodiment, the canopy may hang down freely from the ceiling or rest on upright elements or be arranged so as to protrude from a wall or by a combination of the aforementioned options.

In a preferred embodiment, the lateral surface of the sleeping region may be delimited, in addition to the electrically conducting curtain, on at least one side by at least one wall. This is advantageous particularly if the canopy is to be manufactured from a solid material and thus a terminating wall may provide more support. Apart from that, this embodiment, particularly if the sleeping region is positioned on a wall or in a corner of a room, may afford additional benefit in terms of aesthetics. In addition, a wall may afford the advantage of providing space for operator control elements, batteries and/or accumulators and lines to the lighting.

In a preferred embodiment, the electrically conducting connecting elements may be embodied as sliding bearings and/or as rolling bearings. This is intended in particular to increase the convenience when displacing the curtain. A combination of different bearings is also possible, as is the possibility that the rail and/or the protrusion of the rail does not have to be consistent continuously over the entire peripheral length of the system. By way of example, an interruption in the protrusion of the rail could make it possible to (de)mount curtains in a simpler and more rapid manner.

In a further preferred embodiment, these electrically conducting connecting elements may bear an electrically conducting curtain. This functions by a form-fitting, force-fitting and/or materially bonded connection between the connecting elements and the curtain. Preferably, a connecting element may bear the electrically conducting curtain by way of a clamping surface or by way of pins, which may be plugged through eyes in the curtain and in the connecting elements and thus connected to one another. The connection between the connecting elements and the electrically conducting curtain is also electrically conducting.

In a preferred embodiment, lighting may be provided within the sleeping compartment. This is advantageous particularly if, for example, a book is intended to be read in the sleeping compartment. The power supply for this may be effected by way of external power sources. In a particularly preferred embodiment variant, a power source by way of batteries or accumulators may be envisaged within the sleeping compartment. In this way, although an electrical field prevails in the interior of the sleeping compartment, the function of the Faraday cage remains, in that external electrical or electromagnetic fields can be shielded.

In a preferred embodiment, the electrically conducting curtain, the electrically conducting rug, the electrically conducting wall, the electrically conducting canopy and/or the electrically conducting rail system may be earthed by an electrical line. Using a separate cable, this earthing may originate from the sleeping compartment and be guided to a customary socket. It is also possible to provide an overvoltage protection device, which may constitute an additional safety effect, between the bed and the customary socket. In this way, additional protection against electrical accidents or fires can be provided.

In a particularly preferred embodiment, the sleeping compartment is in the form of a Faraday cage. This means that the sleeping compartment can be understood to be a completely inherently closed electrically conducting hollow body. In this way, this hollow body can be regarded as a virtually inherently closed sleeve, without any passages. As is customary with Faraday cages, it is also possible for it to be a cage that is closed with gaps. Electrically conducting gaps of structural and constructional nature or owing to the materials used may be brought about. Specifically, it is possible for the woven cloth fabric used for the curtain to not be manufactured exclusively from electrically conducting material. This produces gaps in the Faraday cage. In preferred embodiments, such gaps may be accepted or even planned and the effect of a Faraday cage may be utilized at the same time.

BRIEF DESCRIPTION OF THE DRAWINGS

Further advantages and details of the invention will emerge from the figures and from the associated description of the figures. In the figures:

FIG. 3 shows a front view of a sleeping compartment with a circular rail system and a dome-like canopy;

FIG. 4 shows a side view of an embodiment variant with a crib for children;

FIG. 5 shows a perspective view of an embodiment variant with crib for children, including detail view of the circular rail system and earthing system with line, plug and overvoltage protection device;

DETAILED DESCRIPTION

Figure 1:
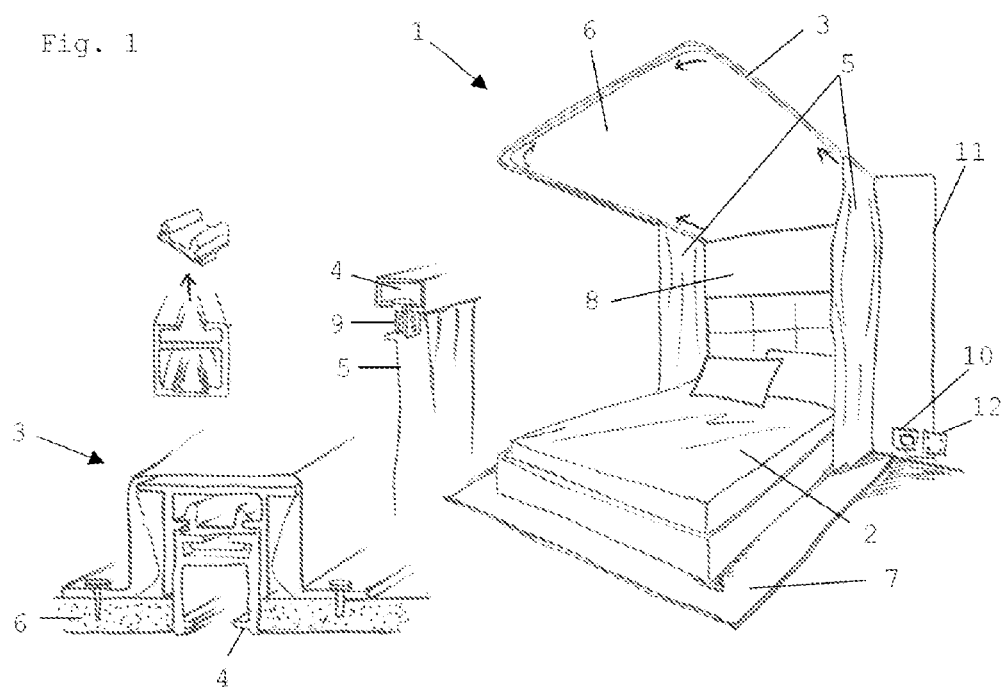
FIG. 1 shows a perspective view of an embodiment variant of a sleeping compartment with rail details.

FIG. 1 shows an exemplary embodiment of a sleeping compartment 1 according to the invention with a sleeping region. In this example, there is a large bed 2 in the sleeping region. Above said bed is the rectangular canopy 6 having a rail system 3 which is fastened to the outer edge and which comprises, inter alia, a rail 4. There is a wall 8 at the head end of the bed 2. Two separate curtains 5 are located at the sides. The bed 2 is standing on a rug 7. Configured next to the bed is an earthing line 11 which leads from the rail system 3 via an overvoltage protection device 12 through the earthing plug 10 into a domestic socket.

The detail view shows that the rail system 3 may be fastened to the canopy 6 from above and a plurality of parts which are connected to one another in a form-fitting manner may, inter alia, comprise the rail 4. A further detail view shows a connecting element 9 which can be displaced in the rail 4 in a sliding manner and which bears the curtain 5.

Figure 2:
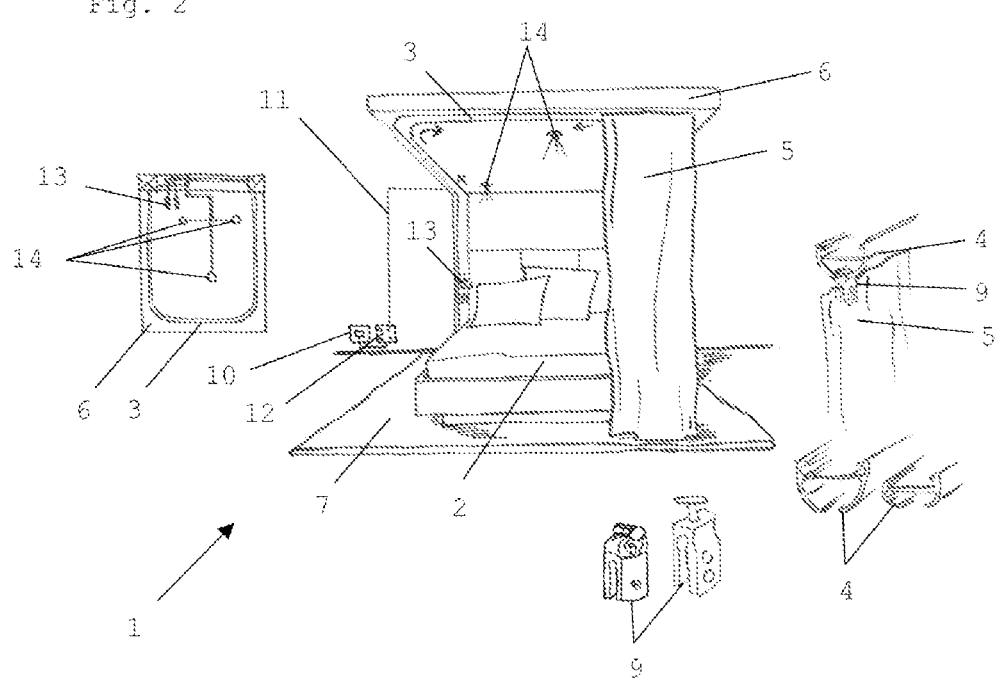
FIG. 2 shows a front view of a sleeping compartment, including plan view and exemplary embodiments for rails and connecting elements.

FIG. 2 shows an embodiment variant of a sleeping compartment 1 similar to FIG. 1 in a front view. In addition, here, three lights 14, which can be controlled by operator control elements 13, are provided in the canopy 6. In a detail view, the lights 14 and their lines to the operator control elements 13 can be identified from a plan view. In further detail views, two different embodiment variants of the connecting elements 9 and of the rail 4 can be seen in each case. The connecting elements 9 have T-shaped bearing elements in order to be threaded into the profile of the rail 4 and to be mounted therein in a displaceable manner. The curtain 5 may be clamped in the connecting elements 9 by a vertical clamping gap and/or be fastened through the eyes of the connecting elements 9 by pins. Furthermore, a further detail view shows a rail 4 in operative connection to a connecting element 9, which bears the curtain 5 and can be displaced in the form of a sliding bearing along the rail axis.

FIG. 3 shows a further embodiment variant of a sleeping compartment 1, wherein in this case the canopy 6 is embodied in a dome-like manner. As a result, the rail system 3 describes a round shape. The circular rail 4 is illustrated in a detail view. Said rail, compared with embodiments in FIG. 2, consists of a profile rod with an appropriate cross section, suitable for holding the connecting elements 9 in the form of sliding bearings. Here, as previously, an earthing of the canopy 6 is likewise provided by an earthing plug 10, an earthing line 11 and an overvoltage protection device 12.

FIG. 4 shows a further embodiment variant of a sleeping compartment 1 with a crib 2 for children. As in FIG. 3, a circular-round rail system 3 is present here, as a result of which the entire bed 2 can be enveloped with a curtain 5. Owing to a decorative cover, the rail system 3 cannot be seen in this Figure.

FIG. 5 shows the embodiment variant of a sleeping compartment 1 from FIG. 4 from a different perspective and without a decorative cover of the canopy 6, as a result of which the circular-round rail system 3 can be seen. The curtain 5 can be displaced along the curved rail 4. As in all other embodiments, earthing may also be effected here by leading the rail system 3 to a domestic socket by an earthing line 11 via an overvoltage protection device 12 with the aid of an earthing plug 10. These apparatuses are shown separately as individual parts in a detail view.

Figure 6:
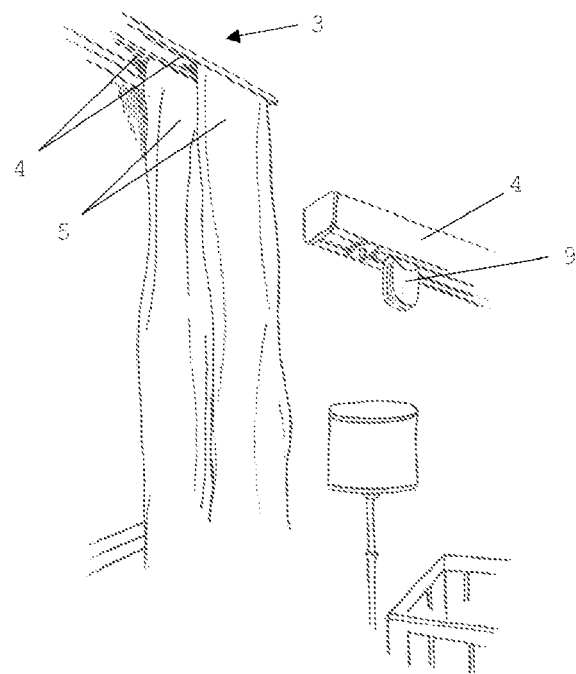
FIG. 6 shows a perspective view of a double rail system and a stop apparatus for a connecting element.

FIG. 6 shows a further embodiment variant of a rail system 3 with two rails 4 running in parallel. It is thus possible for two curtains 5 that are independent of one another to be displaced and to mutually overlap, in order to produce gap-less shielding. As indicated in FIG. 6, such a double rail system may also be used for a window curtain. A further detail view shows a rail 4 with a stopper which delimits the displacement travel of the connecting element 9. In this variant, the connecting element 9 uses a clamping head to bear the curtain 5.

Figure 7:
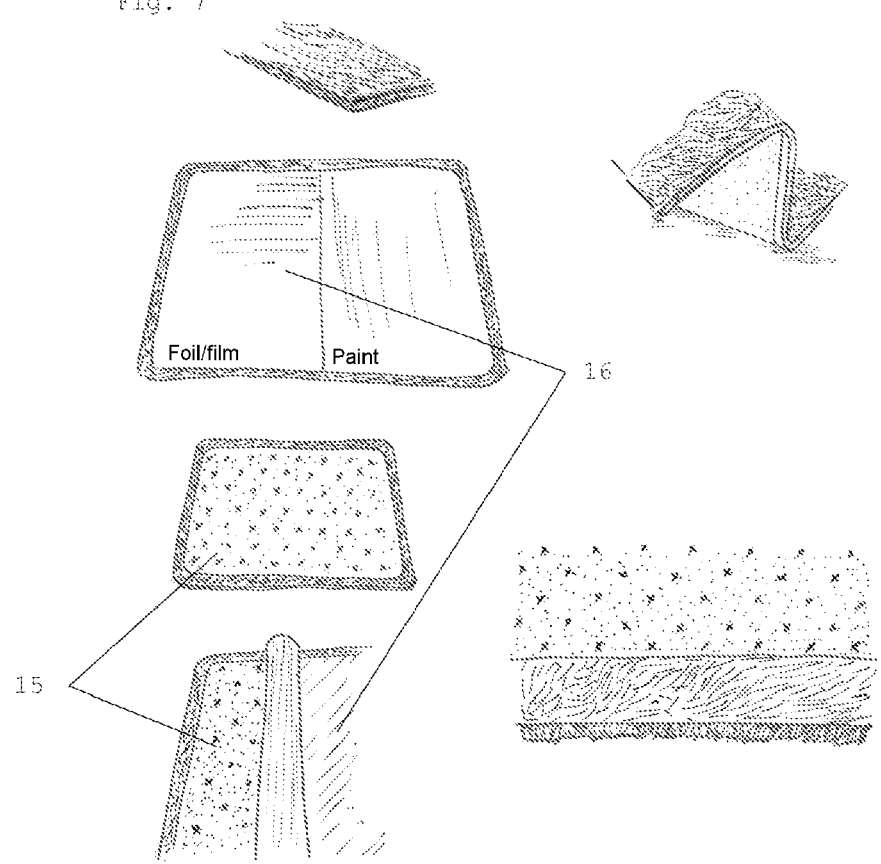
FIG. 7 shows different embodiment variants of a rug.

FIG. 7 shows various views of the rug 7. Said rug may consist of an insulating layer 15 which rests on the floor and of an electrically conducting foil/film 16. As illustrated in a detail view, the foil/film 16 may simply be rolled out over the rug. As an alternative or in addition, instead of an electrically conducting foil/film, it is also possible for an electrically conducting paint to be used.

LEGEND TO THE REFERENCE SIGNS

1 Sleeping compartment
2 Bed
3 Rail system
4 Rail
5 Curtain
6 Canopy
7 Rug
8 Wall
9 Connecting element
10 Earthing plug
11 Earthing line
12 Overvoltage protection device
13 Operator control element (potentially including accumulator and battery)
14 Lighting element
15 Insulating layer
16 Foil/film or paint

The invention claimed is:

1. A sleeping compartment comprising:
a sleeping region;
an electrically conducting curtain that is arrangeable around the sleeping region;
a rail system by which the conducting curtain is mounted in a displaceable manner, the rail system comprising at least one rail and a multiplicity of connecting elements;
the connecting elements being connected to the conducting curtain and being mounted in the at least one rail in a displaceable manner, and
the rail system being configured such that the conducting curtain is connected to the at least one rail in an electrically conducting manner.

2. The sleeping compartment as claimed in claim 1, wherein the at least one of the rail system comprises at least one protrusion for mounting of the connecting elements, and the at least one protrusion extends along a rail axis of the rail.

3. The sleeping compartment as claimed in claim 2, wherein the connecting elements each comprise at least one of sliding or rolling elements which, for the displaceable mounting, rest on the at least one protrusion.

4. The sleeping compartment as claimed in claim 1, wherein the sleeping region is delimited toward a bottom by an electrically conducting rug.

5. The sleeping compartment as claimed in claim 1, wherein the sleeping region is delimited toward a top by an electrically conducting canopy.

6. The sleeping compartment as claimed in claim 5, wherein the canopy is arranged to hang freely from a ceiling, or to rest on upright elements.

7. The sleeping compartment as claimed in claim 5, wherein the canopy is arranged to protrude from a wall.

8. The sleeping compartment as claimed in claim 1, wherein a lateral surface of the sleeping region is delimited by an electrically conducting wall.

9. The sleeping compartment as claimed in claim 8, wherein the sleeping region is delimited toward a bottom by an electrically conducting rug, the sleeping region is delimited toward a top by an electrically conducting canopy, and at least one of the canopy, the walls, the curtain, or the rug is at least partially embodied from at least one of an electrically conducting solid material, an electrically conducting foil/film, an electrically conducting textile, or an electrically conducting paint.

10. The sleeping compartment as claimed in claim 8, wherein at least one of the electrically conducting curtain, the electrically conducting rug, the electrically conducting wall, the electrically conducting canopy, or the electrically conducting rail system is connected to earthing by an electrical line.

11. The sleeping compartment as claimed in claim 10, wherein the earthing includes an overvoltage protection device.

12. The sleeping compartment as claimed in claim 1, wherein the connecting elements which are electrically conducting bear the electrically conducting curtain by at least one of a form-fitting, force-fitting, or materially bonded connection, and said connection provides an electrical connection between the connecting element and the curtain.

13. The sleeping compartment as claimed in claim 1, further comprising at least one light within the sleeping compartment.

14. The sleeping compartment as claimed in claim 1, wherein the sleeping compartment comprises a Faraday cage.

15. The sleeping compartment as claimed in claim 1, wherein the conducting curtain is earthed by the at least one rail.

\* \* \* \* \*